United States Patent [19]
Masuko et al.

[11] Patent Number: 5,214,660
[45] Date of Patent: May 25, 1993

[54] LASER DIODE MODULE AND METHOD FOR FABRICATING THE SAME

[75] Inventors: Takayuki Masuko; Shunichi Satoh; Tetsuo Ishizaka, all of Kawasaki, Japan

[73] Assignee: Fujitsu Limited, Kanagawa, Japan

[21] Appl. No.: 763,703

[22] Filed: Sep. 23, 1991

[30] Foreign Application Priority Data

Sep. 25, 1990 [JP] Japan .................. 2-251829

[51] Int. Cl.[5] .................................. H01S 3/04
[52] U.S. Cl. .................................. 372/34; 372/36; 385/34
[58] Field of Search .............. 372/36, 34; 385/34

[56] References Cited

U.S. PATENT DOCUMENTS

| | | | |
|---|---|---|---|
| 4,399,541 | 8/1983 | Kovats et al. | 372/36 |
| 4,803,361 | 2/1989 | Aiki et al. | 250/227 |
| 5,005,178 | 3/1991 | Kluitmans et al. | 372/36 |
| 5,068,865 | 11/1991 | Ohshima et al. | 372/36 |

FOREIGN PATENT DOCUMENTS

| | | |
|---|---|---|
| 57-102390 | 6/1982 | Japan . |
| 58-77273A | 5/1983 | Japan . |
| 60-52079A | 3/1985 | Japan . |
| 61-234588 | 10/1986 | Japan . |
| 62-188293 | 8/1987 | Japan . |

OTHER PUBLICATIONS

Applied Optics, vol. 27, No. 13, Jul. 1, 1988, New York, U.S., p. 2632.

Primary Examiner—Léon Scott, Jr.
Attorney, Agent, or Firm—Armstrong, Westerman, Hattori, McLeland & Naughton

[57] ABSTRACT

A thermistor assembly is formed by fixedly attaching a thermistor on to a base formed of a material having good heat conductivity and the thermistor assembly and an LD chip are fixedly attached on to a carrier arranged in contact with an electronic cooling element using brazing materials with different melting points, so that, when, for example, the thermistor is found faulty, the thermistor can be easily exchanged with a good one.

19 Claims, 8 Drawing Sheets

LASER DIODE MODULE AND METHOD FOR FABRICATING THE SAME

BACKGROUND OF THE INVENTION

1. Field of the Invention

The present invention relates to a laser diode module (LD module) and a method for fabricating the same.

In a general optical communications system to which intensity modulation/direct detection (IM/DD) is applied, it is adapted, on the principle that the optical output power of a laser diode (LD) varies with the changes in the injection current thereto, such that intensity modulated light is obtained by supplying a modulating current pulse to an LD which is current-biased to the value close to its laising threshold value. Here, since the I-L characteristic (the characteristic indicating the relationship between the injection current and the optical output power) of a laser diode varies with its temperature, in order to obtain a constant operating condition independent of the ambient temperature, it becomes necessary to drive the LD whose temperature is controlled to remain constant or to carry out temperature compensation such that a constant optical power may be obtained independently of changes in the temperature of the LD. However, if it is taken into consideration that it is not easy to determine the temperature-dependent changes of the I-L characteristic, achieving accurate temperature compensation is practically difficult, and relying on the temperature compensation only is not favorable when deterioration of the LD is considered. Accordingly, in order to improve the reliability on the LD and eliminate the need for a temperature compensation circuit, it is required to achieve temperature control of the LD itself.

When fabricating an LD module provided with such temperature control, various parts such as the LD chip and a thermistor (thermally sensitive device) have to be fixedly mounted on a carrier with a special joining technique. Therefore, when any of the parts is found faulty after all the parts have been mounted, it is often the case that exchanging only the broken part is impossible. Accordingly, the yield rate of LD modules is not always high. Therefore, there is a demand for an increased yield rate in the fabrication of the LD modules.

2. Description of the Related Art

Referring to FIG. 13, there is shown a structure of the main portion of a conventional LD module in which it is adapted such that the resistance value of a thermistor 206 fixed on to a carrier 204 together with an LD chip 202 is detected and the drive current of an electronic cooling element 208 in contact with the carrier 204 is controlled so that the resistance value may be kept constant. Incidentally, the optical system for coupling the light output from the LD chip 202 to an optical fiber is not shown. Reference numeral 210 denotes a terminal for connecting the thermistor 206 with an external circuit, 212 denotes a terminal for connecting the electronic cooling element 208 with an external circuit, and 214 denotes a terminal for connecting the LD chip 202 with an external circuit.

When fabricating such a conventional LD module as shown in FIG. 13, an Au/Sn alloy is usually used for joining the LD chip and thermistor to the carrier. Therefore, when such trouble occurs that the thermistor gets broken after the LD chip and thermistor have been mounted on a carrier, it is impossible to melt the alloy for removing only the thermistor to exchange it with a good one and, hence, the module becomes a condemned goods. At this time, the most expensive LD chip becomes useless and, thus, the conventional arrangement was not suitable for improving the yield rate in the fabrication of the modules.

On the other hand, in conventional LD modules, the connections between the terminals for external connection and the thermistor and the like are usually provided by bonding wires made of gold having good heat conductivity. Hence, according to the temperature difference between the module and the surroundings, heat flows into the thermistor from the outside through the terminal and bonding wire or heat flows out of the thermistor to the outside through the bonding wire and terminal and, thus, there has been a problem that accurate temperature control has not been achievable.

Referring to FIG. 14, reference numeral 216 indicates the I-L characteristics of the module when the internal temperature and the external temperature are equal and $I_{th}$ indicates the laising threshold current. When the ambient temperature of the module becomes relatively high, heat flows into the thermistor through the terminal and bonding wire to make the temperature of the thermistor higher than that of the carrier and LD chip. As a result, the LD chip is controlled to a lower temperature than the right temperature and the I-L characteristic is shifted to the left as indicated by 218 in FIG. 14 and the threshold current $I_{th}$ also decreases. When, on the other hand, the ambient temperature of the module becomes relatively low, heat flows from the thermistor to the outside through the bonding wire and terminal and the temperature of the thermistor becomes lower than the temperature of the LD chip and carrier. As a result, the LD chip is controlled to a relatively high temperature and the I-L characteristic makes a parallel translation to the right as indicated by 220 in FIG. 14. The variation in the oscillating threshold current $I_{th}$ due to such change in the ambient temperature is 2–3 mA and this variation cannot be neglected in an LD module applied to a high-speed system (for example, at 1.8 Gb/s).

SUMMARY OF THE INVENTION

An object of the present invention is to provide an LD module, and a fabrication method of the same, suitable for improving the yield rate in the fabrication.

Another object of the present invention is to provide an LD module with which highly accurate temperature control of the LD chip is possible.

According to an aspect of the present invention, there is provided a laser diode module comprising: an electronic cooling element; a carrier provided in contact with the electronic cooling element; a laser diode chip provided on the carrier; and a thermistor assembly provided on the carrier in the vicinity of the laser diode; wherein the thermistor assembly is formed of a thermistor fixedly attached on to a base having good heat conductivity.

According to another aspect of the present invention, there is provided a method for fabricating a laser diode module comprising: a first step of fixedly attaching a thermistor on to a base with good heat conductivity using a first brazing material to thereby form a thermistor assembly; a second step of fixedly attaching a laser diode chip on to a carrier provided in contact with an electronic cooling element using a second brazing material; and a third step of fixedly attaching the thermistor assembly on to the carrier in the vicinity of the laser diode chip using a third brazing material whose melting point is lower than the melting points of the first and second brazing materials.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Figure 1:
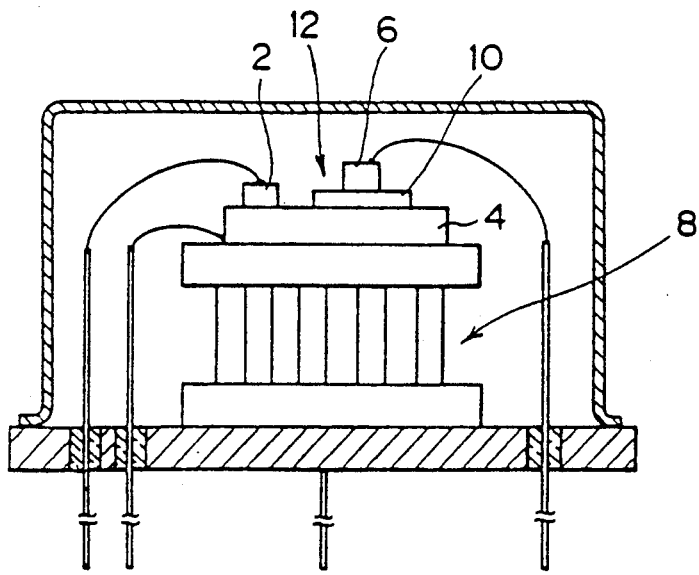
FIG. 1 is a sectional view showing the basic structure of an LD module according to the present invention.

A preferred embodiment of the present invention will be described below in detail with reference to the accompanying drawings. Throughout the drawings, parts essentially the same are denoted by corresponding reference numerals.

FIG. 1 is a diagram showing the basic structure of an LD module of the present invention.

In an LD module in which it is adapted such that the resistance value of a thermistor 6, mounted on a carrier 4 together with an LD chip 2, is detected and the driving current of an electronic cooling element 8 in contact with the carrier 4 is controlled so that the detected resistance value may be kept constant, the present LD module is arranged by forming a thermistor assembly 12 with a thermistor 6 fixedly attached on to a base 10 made of a material having good heat conductivity and then fixedly attaching the thermistor assembly 12 on to the carrier 4.

Figure 2:
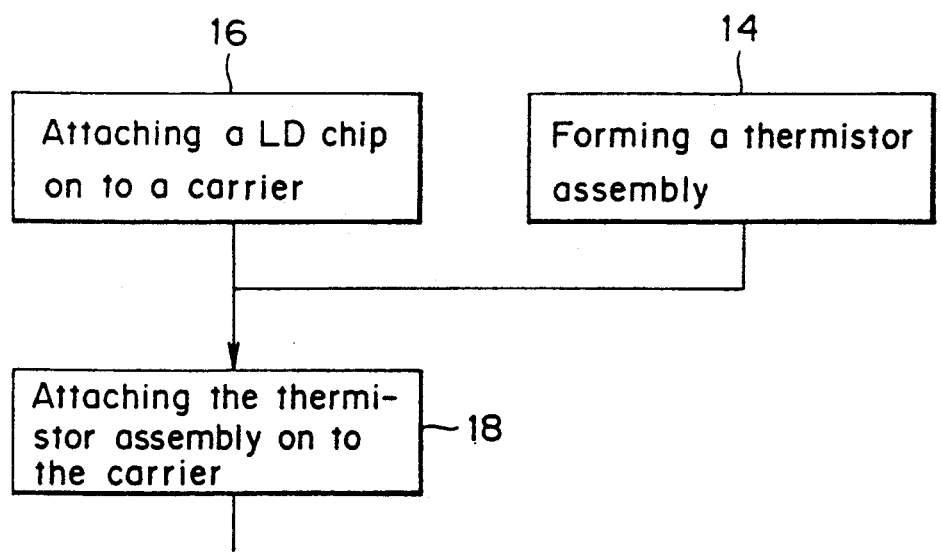
FIG. 2 is a flow chart of a fabrication method of an LD module according to the present invention.

The method for fabricating the LD module of the present invention comprises, in a method for fabricating an LD module in which it is adapted such that the resistance value of a thermistor 6, mounted on a carrier 4 together with an LD chip 2, is detected and the driving current of an electronic cooling element 8 in contact with the carrier 4 is controlled so that the detected resistance value may be kept constant, as shown in the flow chart of FIG. 2, the first step 14 of fixedly attaching a thermistor 6 on to a base 10 with good heat conductivity using a first brazing material to thereby form a thermistor assembly 12, the second step 16 of fixedly attaching the LD chip 2 on to a carrier 4 using a second brazing material, and the third step 18 fixedly attaching the thermistor assembly 12 on to the carrier 4 in the vicinity of the LD chip 2 using a third brazing material whose melting point is lower than the melting points of the first brazing material and second brazing material.

As the electronic cooling element, a Peltier element can be used. The Peltier element is that uses, for cooling or the like, the Peltier effect, i.e., the production of absorption of heat other than Joule heat at the junction of different conductors or semiconductors when current is passed through the junction. By controlling the drive current of the Peltier element, the heat quantity dissipated from the LD chip to the outside the module through the Peltier element is controlled so that the temperature of the LD chip can be regulated. In the following description, the electronic cooling element will be presupposed to be the Peltier element.

In the conventional arrangement, since, as described above, the LD chip and thermistor are fixedly attached to the carrier using an Au/Sn alloy, for example, it has been unable to remove only the thermistor by remelting the alloy. In such arrangement, in order to make it possible to remove only the thermistor, it might be proposed to use a low-melting point solder only as the alloy for fixing the thermistor, but in such case, the gold plated on the surface of the thermistor for the joining purpose diffuses into the low-melting point solder, or, as it is called, gets "eaten", and hence it becomes unable to satisfactorily fix the thermistor.

On the other hand, according to the arrangement of the present invention, the thermistor is fixedly attached on to a base to thereby provide a thermistor assembly and the thermistor assembly is fixedly attached on to a carrier, and therefore, by using, for example, an Au/Sn alloy for fixedly attaching the thermistor to the base and using an ordinary Pb/Sn eutectic solder for fixedly attaching the thermistor assembly to the carrier, the above described difficulty can be overcome, that is, only the thermistor assembly can be removed for exchanging it with a good one keeping the LD chip, which is fixedly attached using, for example, an Au/Sn alloy, as it stands. More specifically, according to the method of the present invention, since the thermistor is fixedly attached on to a base using a first brazing material to thereby obtain a thermistor assembly, meanwhile the LD chip is fixedly attached on to a carrier using a second brazing material, and then, the thermistor assembly is fixedly attached on to the carrier in the vicinity of the LD chip using a third brazing material, whose melting point is lower than the melting points of the first brazing material and second brazing material, only the thermistor assembly can be removed for exchanging it with a good one after the LD chip and thermistor have been mounted by heating the module to a temperature higher than the melting point of the third brazing material and lower than the melting point of the first and second brazing materials.

According to the present invention as described above, it becomes possible to provide an LD module suitable for improving the yield rate in the fabrication. The purpose of using a material with good heat conductivity for the base is to prevent a great temperature gradient from being produced in the base making it difficult to detect an accurate temperature of the LD chip.

Figure 3:
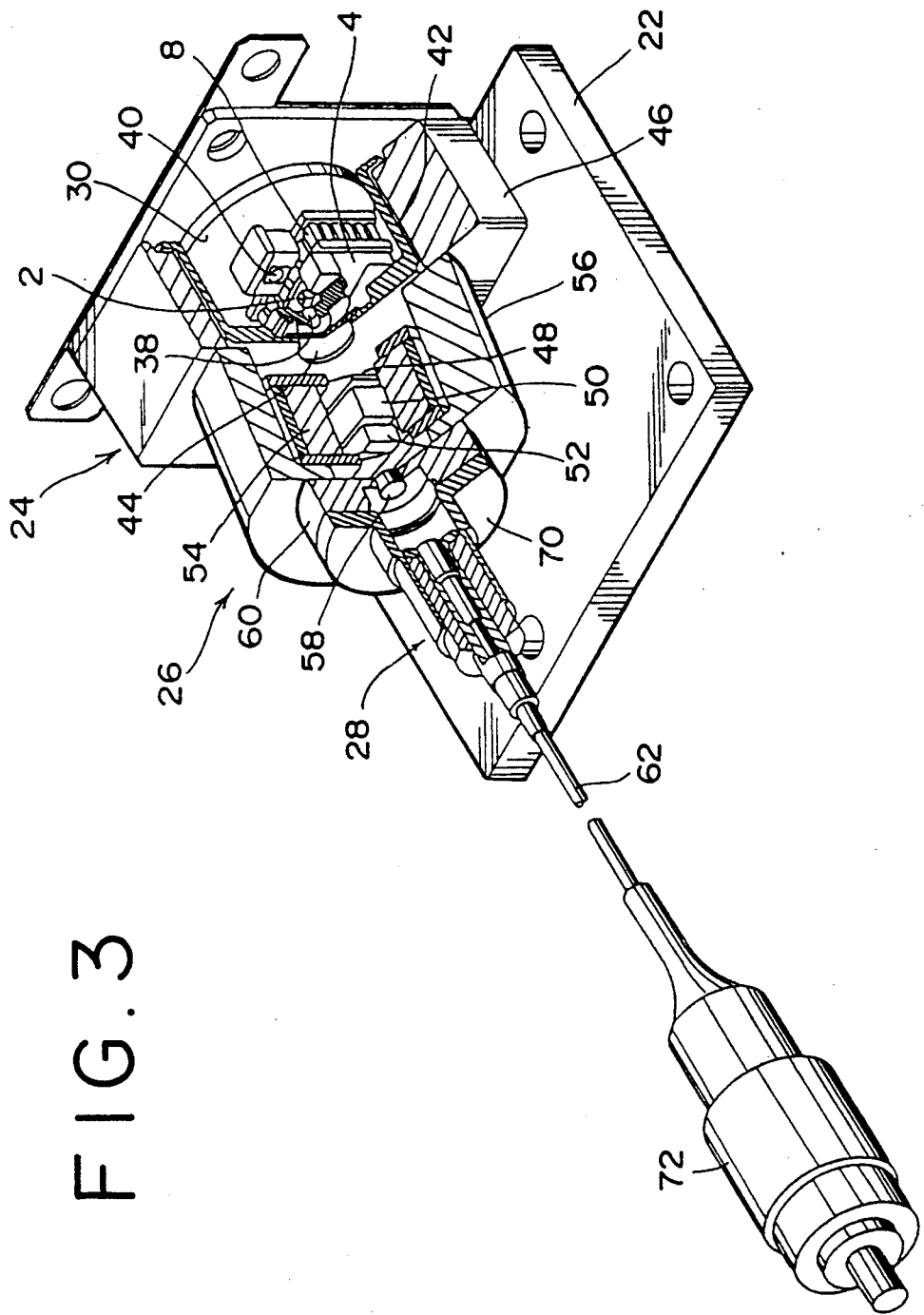
FIG. 3 is a perspective view partially broken away of an LD module for use in executing the present invention.

FIG. 3 is a perspective view partially broken away of an LD module for use in executing the present invention. The LD module is integrally formed of an LD assembly 24, an optical isolator 26, and a fiber assembly 28 fixed on to a substrate 22.

In the LD assembly 24, reference numeral 30 denotes a stem on which such component parts as an LD chip are mounted, 8 denotes a Peltier element fixed on the stem 30, 4 denotes a carrier made of metal or the like with good heat conductivity fixed on the Peltier element 32, 2 denotes an LD chip fixed on the carrier 4, 38 denotes a lens for collimating the rays of light emitted from the LD chip 2, 40 denotes a photodiode for sensing the light backwardly emitted from the LD chip 2, 42 denotes a cap fixed on the stem 30 for hermetical sealing, 44 denotes a transmission window sealing up the portion where the emitted light from the LD passes through the cap 42, and 46 denotes a frame for receiving the portion hermetically sealed by the cap 42 and the stem 30.

In the optical isolator 26, a prism 48 formed of a double refractive crystal such as rutile, a Faraday rotator 50 formed of a magneto-optic crystal such as YIG (yttrium iron garnet), and a prism 52 similar to the aforesaid prism are arranged in the optical path in order of mention, and a permanent magnet 54 is placed around these devices to provide the Faraday rotator 50 with a predetermined magnetic field in the direction in which the light progresses. The prisms 48 and 52, Faraday rotator 50, and permanent magnet 54 are fixed in place within a frame 56.

The fiber assembly 28 is integrally formed of a lens holder 60 holding a lens 58 such as a convergent rod lens and a fiber holder 70 holding an optical fiber 62. Reference numeral 72 denotes an optical connector fixed to one end of the optical fiber 62.

The light emitted through the transmission window 44 of the LD assembly 24 is transmitted through the optical isolator 26 with high transmittance in the forward direction and introduced into the optical fiber 62 so as to be transmitted to the receiver side. Meanwhile, the undesirably produced light reflected and returning from the end face of the fiber in the optical connector 72 or the like is eliminated by a high attenuation rate in the optical isolator 26 and substantially no portion of it returns to the LD assembly 24. Accordingly, it becomes possible to perform direct modulation on the LD chip 2 while maintaining a stabilized operation of the LD chip 2.

Figure 4:
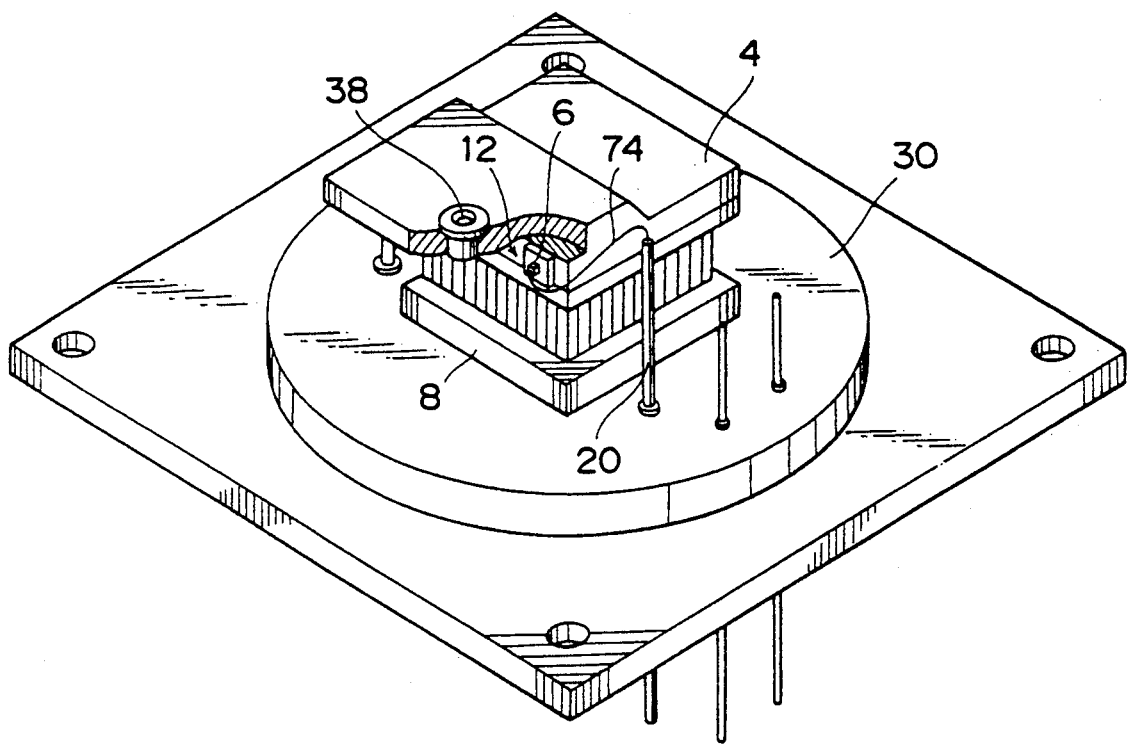
FIG. 4 is a perspective view partially broken away of the main portion of an LD assembly showing a first embodiment of the present invention.

FIG. 4 is a perspective view partially broken away of the main portion of an LD assembly showing a first embodiment of the present invention. At the position on the carrier 4 corresponding to the lens 38, there is mounted the LD chip (not shown in FIG. 4), and the thermistor assembly 12 for temperature control is fixedly attached by soldering to the carrier 4 in the vicinity of the LD chip. Reference numeral 20 denotes a terminal for external connection, formed for example of kovar, erected in a hole formed in the stem 30 with an insulator such as glass interposed therebetween. In the present embodiment, the thermistor 6 and the terminal 20 are interconnected by a bonding wire 74 of gold.

Figure 5:
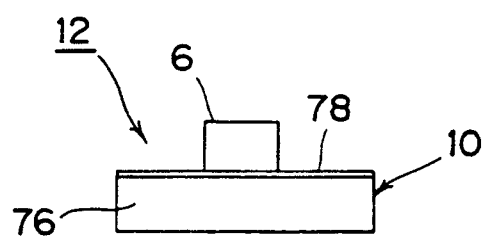
FIG. 5 is an explanatory diagram of a thermistor assembly in the first embodiment of the present invention.

FIG. 5 is an explanatory diagram of a thermistor assembly in the first embodiment of the present invention. In this embodiment, the base 10 to which the thermistor 6 is fixedly attached is formed of metal. Since the metal in general has relatively good heat conductivity and the metal is a good electrical conductor, there is hardly produced a temperature gradient between the thermistor and the carrier and, in addition, the wiring for one of the electrodes (for example, grounding electrode) of the thermistor can be eliminated. In concrete terms, the base 10 is a copper plate 76 provided with gold plating 78 formed on the side on to which the thermistor 6 is fixedly attached. The thermistor 6 is to be fixedly attached on to the base 10 by joining the gold electrode (not shown) of the thermistor 6 to the gold plating 78 using an Au/Sn alloy. Since the heat conductivity of the copper plate 76 and the gold plating 78 is very high, the above described arrangement is suitable for execution of the present invention.

The thermistor assembly 12 is fixedly attached on to the carrier 4 using, for example, a Pb/Sn eutectic solder whose melting point is 183° C. The fixing of the thermistor assembly 12 to the carrier 4 is performed after fixedly attaching a thermistor 6 to a base 10 to thereby turn them into the assembly and mounting an LD chip on the carrier 4. By fabricating a module as described above, when the thermistor 6 is found faulty after the thermistor assembly 12 and LD chip have been mounted on the carrier, the Pb/Sn eutectic solder only may be remelted by heating the carrier 4 up to the temperature at around 200° C., for example, to thereby remove only the thermistor assembly 12.

Figure 6:
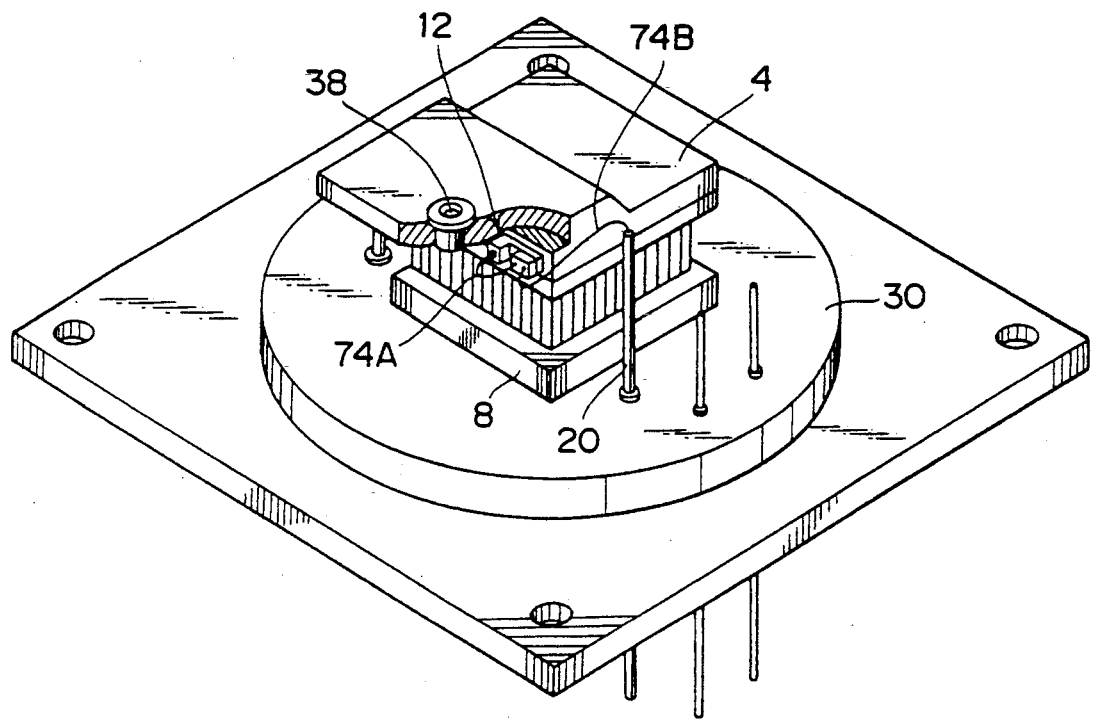
FIG. 6 is a perspective view partially broken away of the main portion of an LD assembly showing a second embodiment of the present invention.
Figure 7:
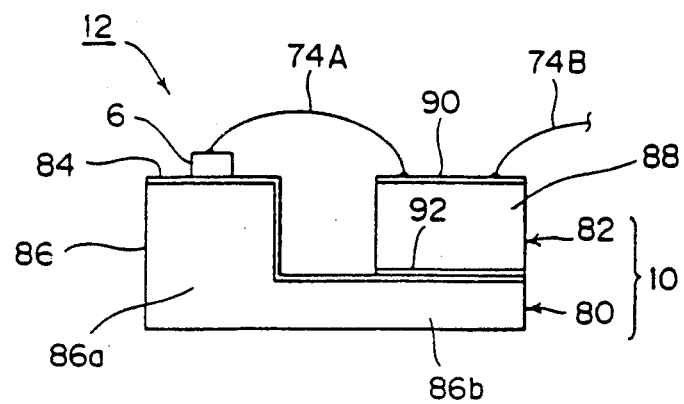
FIG. 7 is an explanatory diagram of a thermistor assembly in the second embodiment of the present invention.

FIG. 6 is a perspective view partially broken away of the main portion of an LD assembly showing a second embodiment of the present invention, and FIG. 7 is an explanatory diagram of a thermistor assembly in the second embodiment. In the present embodiment, the base 10 is formed of a metal block 80 to which the thermistor 6 is to be fixedly attached and a relay block 82 provided in the vicinity of the portion of the metal block 80 on to which the thermistor 6 is to be fixedly attached and the thermistor 6 and the terminal 20 are wire-bonded by way of the relay block 82.

According to such arrangement, since the thermistor 6 and the terminal 20 are wire-bonded by way of the relay block 82, there hardly occurs the flow of heat into the thermistor, and the flow of heat out of the thermistor, through the bonding wire and terminal when internal temperature and external temperature of the module are different. Accordingly the temperature of the thermistor is kept virtually equal to the temperature of the LD chip and carrier at all times and, hence, highly accurate temperature control of the LD chip can be achieved.

The metal block 80 is formed of a copper block 86, having a thick wall portion 86a and a thin wall portion 86b, provided with gold plating 84 formed on its surface, and the thermistor 6 is fixedly attached to the surface of the thick wall portion 86a using an Au/Sn alloy. The relay block 82 is formed of an electrical insulating member 88 having good heat conductivity provided with metallic films 90 and 92 formed on the front face and rear face, respectively. The relay block 82 is fixedly attached on to the thin wall portion 86b using an Au/Sn alloy. The thermistor 6 and the metallic film 90 are interconnected by a bonding wire 74A and the metallic film 90 and the terminal 20 are interconnected by another bonding wire 74B. By forming the metallic film 90 by gold, the wire bonding can be easily carried out. As the insulating member 88 with good heat conductivity, beryllia ceramic can be used. The beryllia ceramic provides good workability and it is easy to form a metallic film on the beryllia ceramic. The purpose of using a material having good heat conductivity as the material of the insulator 88 is to have the heat flowed into the relay block 82 through the terminal 20 and the bonding wire 74B (when the external temperature is relatively high) absorbed by the Peltier element 8 so that the heat flowed into the relay block 82 may be prevented from flowing into the thermistor 6 through the bonding wire 74A.

In the present embodiment, there is provided a space between the thick wall portion 86a of the copper block and the relay block 82. By this arrangement, when the thermistor 6 is fixedly attached on to the metal block 80 using the Au/Sn alloy, the molten alloy hardly reaches the top face of the relay block 82, whereby the purity of the metallic film 90 formed of gold can be secured and deterioration of the wire bonding hardly occurs. Also in this embodiment, the thermistor assembly is fixedly attached on to the carrier 4 using Pb/Sn eutectic solder.

Figure 8:
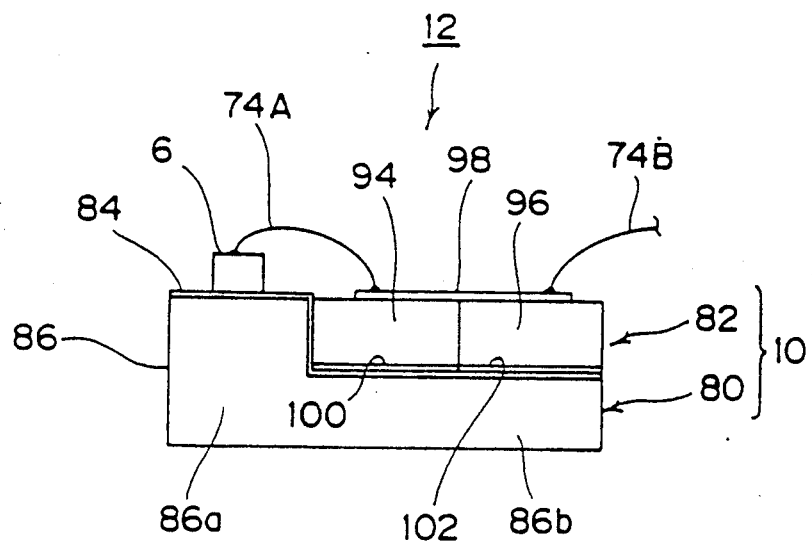
FIG. 8 is an explanatory diagram of a thermistor assembly in a third embodiment of the present invention.

FIG. 8 is an explanatory diagram of a thermistor assembly in a third embodiment of the present invention. The metal block 80 is constituted, the same as in the preceding embodiment, of a copper block 86 provided with gold plating 84 formed at least on the portion on which the thermistor 6 is to be fixedly attached. The copper block 86 is formed of a thick wall portion 86a on which the thermistor 6 is to be fixedly attached and a thin wall portion 86b on which a relay block is to be installed. The relay block 82 is formed of a first insulator 94 with a heat insulating property and a second insulator 96 with good heat conductivity, fixedly attached on to the thin wall portion 86b of the copper block with the first insulator 94 placed on the side toward the thermistor 6, and provided with a metallic film 96 of gold formed on the first insulator 84 and second insulator 86. The thermistor 6 and the metallic film 98 are interconnected by a bonding wire 74A and the metallic film 98 and the terminal 20 are interconnected by another bonding wire 74B. Reference numerals 100 and 102 denote metallic films for fixedly attaching the first insulator 94 and the second insulator 96 on to the metal block 80, respectively.

According to the described arrangement, the thermistor 6 and the first and second insulators 94 and 96 can be fixedly attached on to the metal block 80 using an Au/Sn alloy, while the metallic block 80 can be fixedly attached on to the carrier 4 using a Pb/Sn eutectic solder. Therefore, when a fault in the thermistor 6 is found after the thermistor assembly has been fixedly attached on to the carrier 4, only the thermistor assembly may be removed from the carrier 4, having the LD chip fixedly attached on to the carrier 4 with the use of an Au/Sn alloy left as it stands.

As the material for the heat-insulating first insulator 94, alumina ceramic can be used and, as the material for the second insulator 96 with good heat conductivity, beryllia ceramic can be used. The effect obtained from the use of the second insulator 96 in the present embodiment is the same as that obtained from the use of the insulator with good heat conductivity in the preceding embodiment and, hence, its description will be omitted. In the present embodiment, a heat insulating first insulator 94 formed of alumina or the like is provided between the second insulator 96 and the thick wall portion 86a of the metal block and the wire bonding between the metallic film 98 and the thermistor 6 is carried out on the first insulator 94, and therefore, the length of the bonding wire 74A can be made shorter and wire bonding becomes easier. Further, since the first insulator has a heat insulating property, when, for example, heat flows from outside the module into the metal block 80 and carrier 4 through the bonding wire 74B and second insulator 96, the temperature of the thermistor 6 hardly changes due to the inflow of heat. This effect is more remarkable when thin wall portion 86b is thinner. In the present embodiment, since the top face of the thick wall portion of the metal block 80 and the top faces of the first insulator 94 and second insulator 96 lie substantially in the same plane, the metallic film 98 can be easily formed and the wire bonding can also be easily performed.

Figure 9:
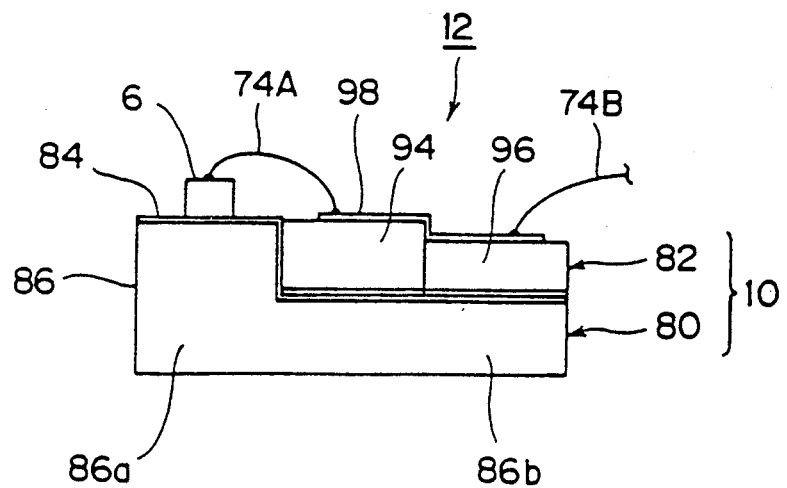
FIG. 9 is an explanatory diagram of a thermistor assembly in a fourth embodiment of the present invention.

FIG. 9 is an explanatory diagram of a thermistor assembly in a fourth embodiment (variation of the third embodiment) of the present invention. In this embodiment, the top face of the thick wall portion of the metal block 80 and the top face of the first insulator 94 lie substantially in the same plane, and the second insulator 96 is formed thinner than the fist insulator 94 (for example, into a thickness of 1 mm or below). According to the described arrangement, the heat flowing in, for example, through the terminal 20 and the bonding wire 74B can easily and advantageously escape to the metal block 80 and carrier 4 through the thin-walled second insulator 96.

Figure 10:
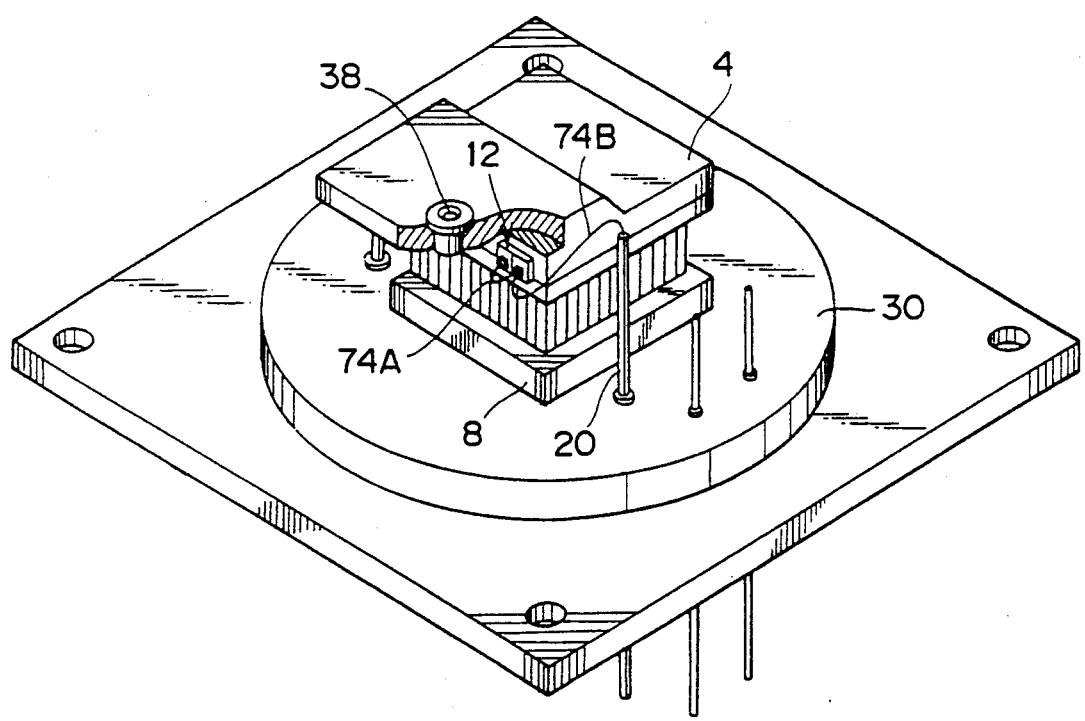
FIG. 10 is a perspective view partially broken away of the main portion of an LD assembly showing a fifth embodiment of the present invention.
Figure 11:
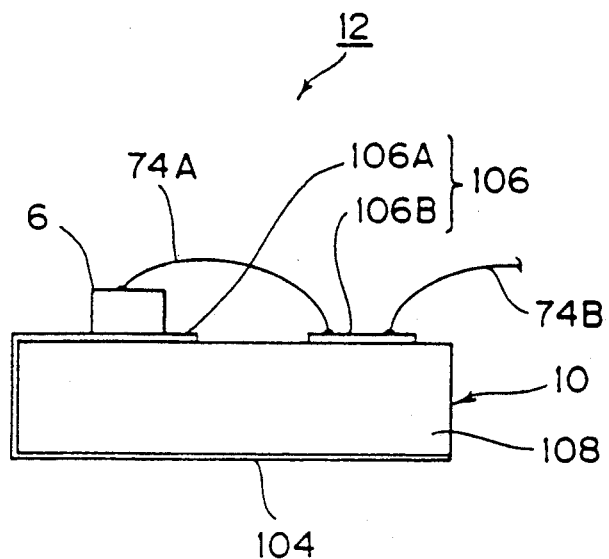
FIG. 11 is an explanatory diagram of a thermistor assembly in the fifth embodiment of the present invention.

FIG. 10 is a perspective view partially broken away of the main portion of an LD assembly showing a fifth embodiment of the present invention and FIG. 11 is an explanatory diagram of a thermistor assembly in the fifth embodiment. In this embodiment, the base 10 is formed of an insulator 108 with good heat conductivity provided with a first metallic film 104 and a second metallic film 106 formed on the rear face to be fixedly joined with the carrier 4 and the front face on to which the thermistor 6 is to be fixedly attached, respectively. The first metallic film 104 and second metallic film 106 are formed of gold so that joining with the use of an Au/Sn alloy is possible. The second metallic film 106 is separated into a first segment 106A electrically connected with the first metallic film 104 and a second segment 106B not electrically connected with the first metallic film 104, and the thermistor 6 is fixedly attached on to the first segment 106A. The thermistor 6 and the second segment 106B are interconnected by a bonding wire 74A, while the second segment 106B and the terminal 20 are interconnected by another bonding wire 74B.

According to the described arrangement, since the insulator 108 with good heat conductivity is used, there is hardly produced a temperature gradient between the thermistor 6 fixedly attached on to the same and the carrier 4 on to which the insulator 108 is fixedly attached, and therefore, the temperature of the LD chip fixedly attached on to the carrier 4 can be accurately detected by the thermistor 6. Further, the heat flowing in from outside the module through the bonding wire 74B can easily escape to the carrier 4 through the insulator 108, and therefore, accurate temperature control of the LD chip can be obtained.

Figure 12:
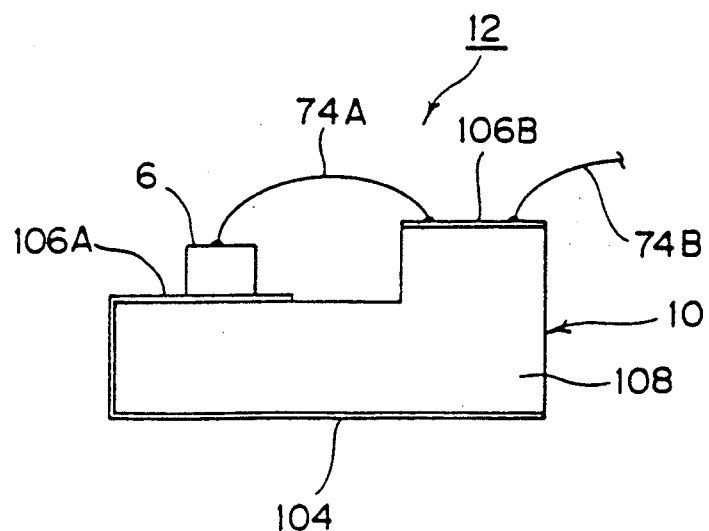
FIG. 12 is an explanatory diagram of a thermistor assembly in a sixth embodiment of the present invention.
Figure 13:
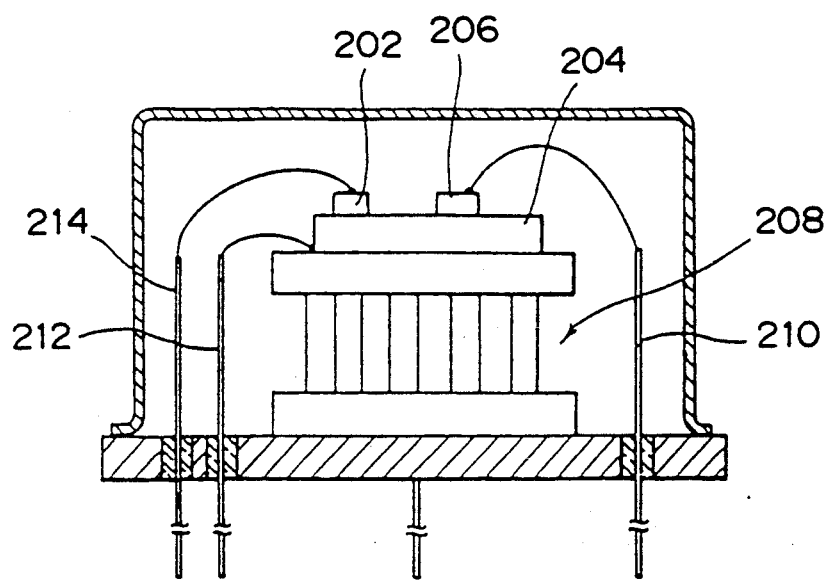
FIG. 13 is a sectional view of a conventional LD module.
Figure 14:
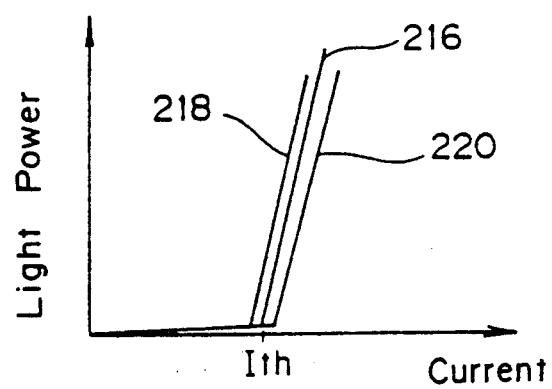
FIG. 14 is a graph showing behaviors of I-L characteristic varying with changes in environmental temperature.

FIG. 12 is an explanatory diagram of a thermistor assembly in a sixth embodiment (variation of the fifth embodiment) of the present invention. In this embodiment, the portion of the insulator 108 where the first segment 106A of the second metallic film is formed is arranged to be thinner than the portion where the second segment 106B is formed. By this arrangement, when the thermistor 6 is fixedly attached on to the first segment 106A using an Au/Sn alloy, this alloy hardly flows to the second segment 106B and, hence, satisfactory wire bonding can be achieved on the second segment 106B.

According to the present invention as described in the foregoing, after the thermistor assembly and the LD chip have been mounted on the carrier, only the thermistor assembly can be removed, and therefore, the LD chip can be saved from becoming useless and an effect is obtained that the yield rate in fabrication of modules can be improved. Further, according to particular embodiments of the present invention, flowing out of heat from the module to the outside through the terminal and bonding wire, or flowing in of heat from outside the module to the thermistor can be minimized, and therefore, the temperature of the thermistor changes according as the temperature of the LD chip changes. Hence, such an effect is obtained that highly accurate temperature control of the LD chip can be achieved.

While the present invention has been described as related to particular embodiments, it is to be understood that the present invention is not limited to the details of such embodiments. For example, the control circuit for maintaining the temperature of the LD constant may be provided outside the LD module or may be provided inside the same.

Thus, preferred embodiments described herein are given by way of illustration only and not limitative of the present invention. The scope of the invention is defined by the appended claims and all changes and modifications as fall within the equivalence of the scope of the claims are therefore to be embraced by the invention.

What is claimed is:

1. A laser diode module, comprising:
   an electronic cooling element;
   a carrier provided in contact with said electronic cooling element;
   a laser diode chip attached on said carrier; and
   a thermistor assembly attached on said carrier in the vicinity of said laser diode, wherein said thermistor assembly is comprised of a thermistor fixedly attached onto a base having good heat conductivity, said thermistor and said base having a first material therebetween, said laser diode chip and said carrier having a second material therebetween, said thermistor assembly and said carrier having a third material therebetween, and the melting point of said third material being lower than the melting points of said first and second materials.

2. A laser diode module according to claim 1, wherein said electronic cooling element is a Peltier element.

3. A laser diode module according to claim 2, wherein said base is made of metal.

4. A laser diode module according to claim 3, wherein said base is a copper plate provided with gold plating formed on the side on which said thermistor is fixedly attached.

5. A laser diode module according to claim 2, wherein said base is formed of a metal block on to which said thermistor is to be fixedly attached and a relay block provided in the vicinity of the portion of said metal block on to which said thermistor is to be fixedly attached, and wherein said thermistor and a terminal for connecting said thermistor with an external circuit therefor are wire-bonded by way of said relay block.

6. A laser diode module according to claim 5, wherein said metal block is a copper block provided with gold plating formed at least on the portion on to which said thermistor is to be fixedly attached and said relay block is an insulator having good heat conductivity provided with a metallic film formed thereon.

7. A laser diode module according to claim 6, wherein said insulator is formed of beryllia ceramic and said metallic film is formed of gold.

8. A laser diode module according to claim 7, wherein said metal block is formed of a thick wall portion to which said thermistor is to be fixedly attached and a thin wall portion to which said relay block is to be fixedly attached.

9. A laser diode module according to claim 8, wherein there is provided a space between said thick wall portion and said relay block.

10. A laser diode module according to claim 5, wherein said metal block is a copper block provided with gold plating formed at least on the portion on to which said thermistor is to be fixedly attached and said relay block is formed of a first insulator having a good heat insulating property and a second insulator having good heat conductivity, which are fixedly attached on to said copper block such that said first insulator is placed on the side toward said thermistor, said first and second insulators being provided with a metallic film formed thereon.

11. A laser diode module according to claim 10, wherein said first insulator is formed of alumina ceramic, said second insulator is formed of beryllia ceramic, and said metallic film is formed of gold.

12. A laser diode module according to claim 11, wherein said metal block is formed of a thick wall portion to which said thermistor is to be fixedly attached and a thin wall portion to which said relay block is to be fixedly attached.

13. A laser diode module according to claim 12, wherein the face of said metal block to which said thermistor is to be fixedly attached and the face of said first and second insulators on which said metallic film is to be formed lie virtually in the same plane.

14. A laser diode module according to claim 12, wherein the face of said metal block to which said thermistor is to be fixedly attached and the face of said first insulator on which said metallic film is to be formed lie virtually in the same plane and said second insulator is formed thinner than said first insulator.

15. A laser diode module according to claim 2, wherein said base is formed of an insulator provided with a first metallic film and a second metallic film formed on the rear face at which said base is to be fixedly attached to said carrier and the front face to which said thermistor is to be fixedly attached, respectively.

16. A laser diode module according to claim 15, wherein said insulator is formed of beryllia ceramic, and said first and second metallic films are formed of gold.

17. A laser diode module according to claim 16, wherein said second metallic film is separated into a first segment electrically connected with said first metallic film and a second segment not electrically connected with said first metallic film.

18. A laser diode module according to claim 17, wherein said thermistor is fixedly attached on to said first segment and said thermistor and a terminal for connecting said thermistor with an external circuit therefor are wire-bonded by way of said second segment.

19. A laser diode module according to claim 18, wherein the portion of said insulator on which said first segment is formed is made thinner than the portion on which said second segment is formed.

* * * * *